· US008912935B1

(12) United States Patent
Smith

(10) Patent No.: US 8,912,935 B1
(45) Date of Patent: Dec. 16, 2014

(54) DIGITAL INPUT FOR A PROGRAMMABLE LOGIC CONTROLLER

(71) Applicant: Maxim Integrated Products, Inc., San Jose, CA (US)

(72) Inventor: Douglas S. Smith, Milpitas, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/141,291

(22) Filed: Dec. 26, 2013

Related U.S. Application Data

(60) Provisional application No. 61/821,466, filed on May 9, 2013.

(51) Int. Cl.
| | |
|---|---|
| H03M 1/00 | (2006.01) |
| H03K 19/003 | (2006.01) |
| H03M 1/12 | (2006.01) |
| G06F 11/34 | (2006.01) |
| G02F 7/00 | (2006.01) |
| H03K 19/177 | (2006.01) |
| G05B 23/02 | (2006.01) |
| G06Q 10/06 | (2012.01) |

(52) U.S. Cl.
CPC .............. *H03M 1/12* (2013.01); *G06F 11/3419* (2013.01); *G02F 7/00* (2013.01); *H03K 19/1776* (2013.01); *H03K 19/17728* (2013.01); *G05B 23/02* (2013.01); *H03K 19/00384* (2013.01); *G06Q 10/06* (2013.01); *H03K 19/17736* (2013.01)

USPC .............................................. 341/137; 326/37

(58) Field of Classification Search
CPC .............. H03M 1/12; H03K 19/00384; H03K 19/1776; H03K 19/17728; H03K 19/17736; G06F 11/3419; G05B 23/02; G02F 7/00; G06Q 10/06
USPC .................... 341/137; 326/37, 38, 39, 40, 41; 702/184, 183, 186
See application file for complete search history.

(56) References Cited

U.S. PATENT DOCUMENTS 7,612,582 B2 * 11/2009 Ward .............................. 326/38

OTHER PUBLICATIONS

Allen-Bradley User Manual, "ControlLogix Digital I/O Modules", Catalog No. 1756-IB16I, Rockwell Automation Publication 1756-UM058G-EN-P, Nov. 2012, pp. 144.

* cited by examiner

*Primary Examiner* — Joseph Lauture
(74) *Attorney, Agent, or Firm* — TIPS Group

(57) ABSTRACT

A digital input includes a galvanically isolated section having an integrating capacitor coupled to a high voltage signal input by at least one current-limiting resistor, a relaxation oscillator coupled across the integrating capacitor, and an electronic switch controlled by the relaxation oscillator. An optical isolator has an input side and an output side, wherein the input side is coupled across the integrating capacitor by the switch, and a low voltage section includes a decoder having an input coupled to the output side of the optical isolator and having a low voltage signal output.

20 Claims, 2 Drawing Sheets

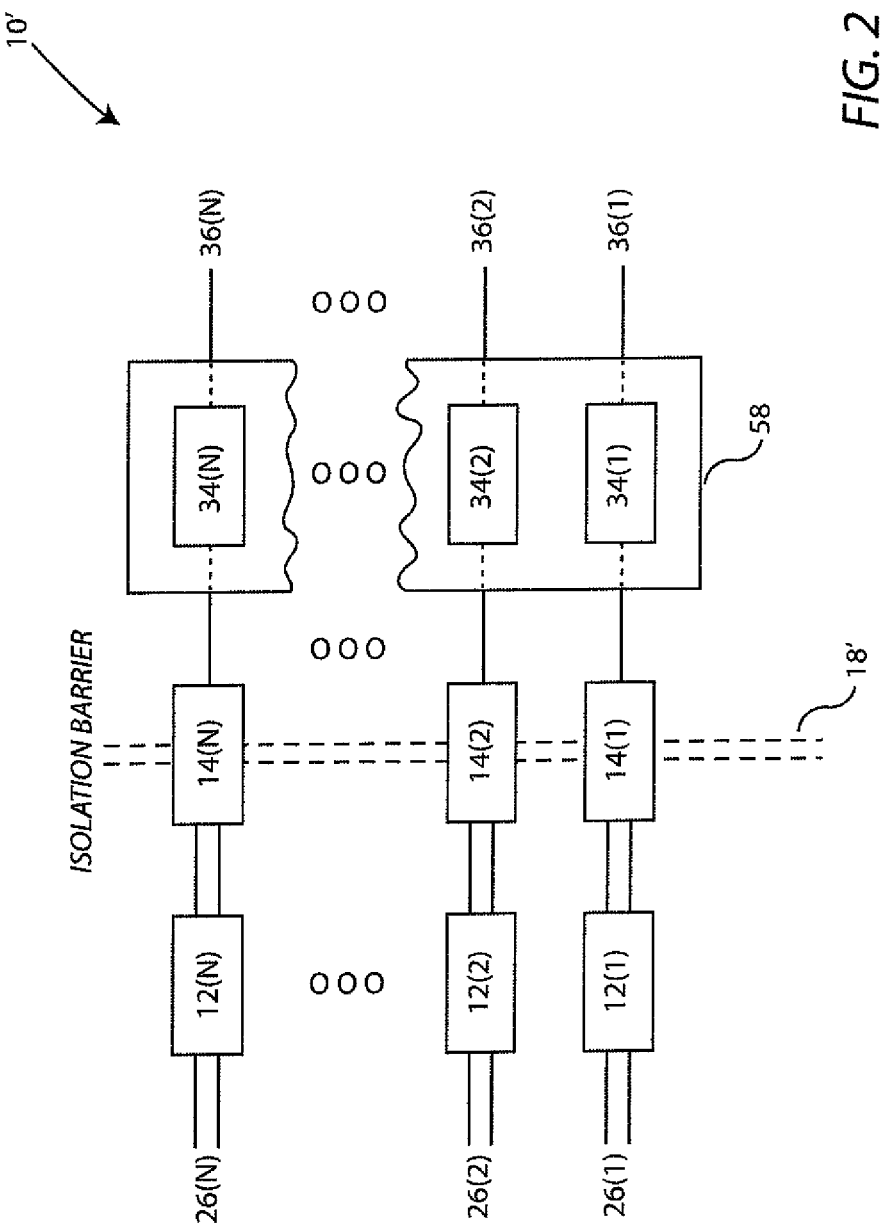

DIGITAL INPUT FOR A PROGRAMMABLE LOGIC CONTROLLER

CROSS REFERENCE TO RELATED APPLICATION(S)

This application claims the benefit of U.S. Provisional Patent Application No. 61/821,466, filed May 9, 2013, which is incorporated herein by reference.

BACKGROUND

A Programmable Logic Controller ("PLC") is a digital computer typically used for automation of electromechanical processes, such as control of machinery on factory assembly lines, amusement rides, or light fixtures, which will be referred to generically herein as "industrial equipment." Unlike general-purpose computers, a PLC is designed for multiple inputs and output arrangements (sometimes referred to as "channels"), extended temperature ranges, immunity to electrical noise, and resistance to vibration and impact. A PLC is an example of a real-time system, since output results must be produced in response to input conditions within a limited time for proper operation of the machinery.

A PLC can be used to monitor switches, such as power on/off switches, emergency cut-off switches, etc. of industrial equipment. The voltages handled by such switches tends to be relatively high, e.g. 24-240 volts. Also, the voltages handled by the switches can be direct current (DC) or alternating current (AC). However, the electronic components of the PLC typically operate at much lower DC voltages, e.g. 3.3-5 volts. Therefore, it is important to provide galvanic isolation between high voltage and low voltage sections of a PLC to prevent damage to, and possibly unsafe operation of, the PLC.

In PLCs input detection circuits ("digital inputs") have been used to convert AC or DC high voltage inputs into low voltage DC outputs. Digital inputs are so-named because they are typically used to detect when a high-voltage switch is opened or closed (a type of binary action), although the actual input voltage is often at least partially analog in nature (e.g. AC, frequency components, transients, etc.). Historically, digital inputs included relays and were referred to as "relay logic."

Galvanic isolation is a principal of isolating functional sections of electrical system to prevent current flow, e.g. no metallic conduction paths are typically permitted between the functional sections. However, energy or information can be exchanged between the functional sections by other methods, such as by capacitive, inductive, optical, acoustic or mechanical coupling Optical isolators have been used in digital inputs to provide galvanic isolation between the high voltage and low voltage circuitries. For example, a pulse width modulator (PWM) can be coupled to the high voltage input signal from a high voltage switch to drive the input of an optical isolator. A low voltage pulse width demodulator can recover the input signal from the output of the optical isolator. However, such a circuit requires a power supply (e.g. 20-50 mW) to operate the PWM which adds expense to input circuitry. Furthermore, since PLCs may have many input channels, e.g. 10, 20 or 40 input channels, a like number of power supplies (often including transformers) must be provided if galvanic isolation is maintained for each channel.

The power supplies required for the PWM tend to be expensive, cumbersome, space-consuming and increase the power consumption of the circuitry. For this reason, some PLC's group their inputs so that they can share a power supply, but this will not provide galvanic isolation within the group.

In certain applications where the input voltage is known a simple resistive divider can be used to power an optical isolator of a digital input. This is advantageous in that galvanic isolation can be provided very inexpensively. However, simple digital inputs of this type will only work at known voltage (and therefore current) levels, and therefore cannot be used as a "universal" digital input for a significant range of input voltages.

These and other limitations of the prior art will become apparent to those of skill in the art upon a reading of the following descriptions and a study of the several figures of the drawing.

SUMMARY

In an embodiment, set forth by way of example and not limitation, a digital input detection circuit includes a galvanically isolated section having an integrating capacitor coupled to a high voltage signal input by at least one current-limiting resistor, a relaxation oscillator coupled across the integrating capacitor, and an electronic switch controlled by the relaxation oscillator. In this example, an optical isolator has an input side and an output side, wherein the input side is coupled across the integrating capacitor by the switch, and a low voltage section includes a decoder having an input coupled to the output side of the optical isolator and having a low voltage signal output.

In certain embodiments, the integrating capacitor is coupled to the at least one current-limiting resistor by at least one diode. In other embodiments, the electronic switch is a Metal Oxide Field Effect Transistor (MOSFET). In further example embodiments, the input side of the optical oscillator comprises a light emitting diode (LED) and/or the output side of the optical comprises a photodetector.

In an example embodiment, the at least one current-limiting resistor is a first resistor coupled to a first node of the high voltage signal input and there is a second current limiting resistor coupled to a second node of the high voltage signal input. In another example embodiment, the at least one diode is a first diode and there is a second diode coupled in series with the first diode across the integrating capacitor. In a still further example, a third diode and a fourth diode are coupled in series across the integrating capacitor and are connected to the second current limiting resistor. In yet another example, the first current limiting resistor is coupled to a node between the first diode and the second diode and the second current limiting resistor is coupled to a node between the third diode and the fourth diode.

In an embodiment, set forth by way of example and not limitation, a self-powered analog-to-digital converter with galvanic isolation includes an integrating capacitor coupled to a high voltage signal input by at least one current-limiting resistor, an encoder powered by a voltage across the integrating capacitor and operative to develop a serialized signal representative of the high voltage signal, and an isolator having an input coupled to an output of the serial encoder. In a further example embodiment, the encoder is formed as part of an integrated circuit. In a still further example embodiment, at least one of the at least one of the integrating capacitor and the isolator are formed as part of the integrated circuit.

In an embodiment, set forth by way of example and not limitation, a multichannel industrial interface includes: (a) a plurality of high voltage input channels each having: (i) an integrating capacitor coupled to a high voltage signal input by at least one current-limiting resistor, (ii) a relaxation oscillator coupled across the integrating capacitor, and (iii) an electronic switch controlled by the relaxation oscillator; (b) a plurality of optical isolators each having an input side and an output side, wherein the input side of each optical isolator is coupled to one of the plurality of high voltage input channels; and (c) a plurality of low voltage output channels each including a decoder having an input coupled one of the optical isolators and having a low voltage channel output. In an example embodiment, the plurality of high voltage input channels are electrically isolated from each other and the plurality of low voltage output channels are formed as part of a single integrated circuit.

An advantage of example embodiments is that isolated power supplies not are required for the high voltage input channels. Instead, power for the galvanically isolated section is derived from the high voltage input to the circuit. This has the advantage of significantly reducing the amount of circuitry and board space required for the digital input and significantly reduces the cost and power dissipation of the circuit.

Further advantages of example embodiments is that digital input can be provided which work over a broad range of voltages while drawing very little current from the sensed circuit. A still further advantage of example embodiments is that a digital input is provided which can provide an approximate measurement of the input voltage.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 2 is a block diagram, set forth by way of example and not limitation, of a multichannel interface for, by way of example, a Programmable Logic Controller.

DETAILED DESCRIPTION OF EXAMPLE EMBODIMENTS

Figure 1:
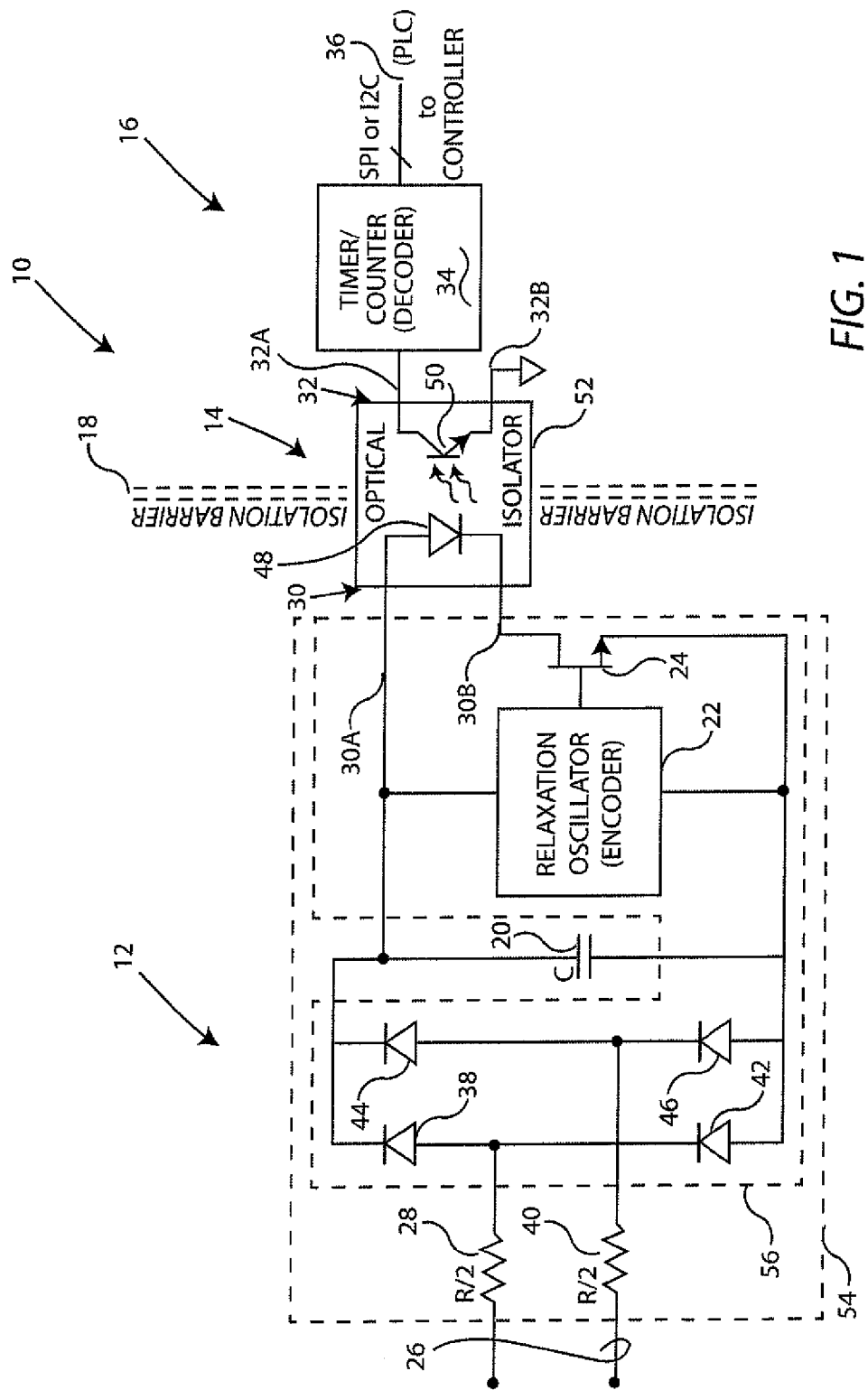
FIG. 1 is a block diagram, set forth by way of example and not limitation, of a digital input detection circuit which operates as a self-powered analog-to-digital converter with galvanic isolation.

FIG. 1 is a block diagram of an input detection circuit ("digital input") 10, set forth by way of example and not limitation, which can be used, for example, with a Programmable Logic Controller or "PLC" (not shown). It will be appreciated by those of skill in the art that the digital input 10 can be used for other purposes, e.g. when a higher voltage input is to be converted into a lower voltage output while maintaining galvanic isolation, between the input and the output, where the voltage input can be within an extended range (e.g. an order of magnitude or more). In this example, the digital input 10 includes a galvanically isolated section 12, an optical isolator 14, and a low voltage section 16. The optical isolator provides galvanic isolation between the galvanically isolated section 12 and the low voltage section 16 as indicated by the isolation barrier 18.

Galvanically isolated section 12 includes, by way of non-limiting example, an integrating capacitor 20, a relaxation oscillator ("encoder") 22 and an electronic switch 24. The integrating capacitor 20 is coupled to a high voltage signal input 26 by at least one current-limiting resistor, e.g. resistor 28. The encoder 22 is coupled across the integrating capacitor 20, and the electronic switch 24 is controlled by the relaxation capacitor.

In this example, optical isolator 14 has an input side 30 and an output side 32. The input side 30 includes two leads 30A and 30B, where lead 30A is coupled to one side of the integrating capacitor 20 and lead 30B is coupled to the other side of integrating capacitor 20 by switch 24. The output side 32 includes two leads 32A and 32B.

Also in this example, the low voltage section 16 includes a timer/controller ("decoder") 34 having an input coupled to lead 32A of the output side 32 of optical isolator 14. Lead 32B of optical isolator 14 is grounded in this example. Decoder 34 has a low voltage signal output 36, which can, for example, conform to SPI or I2C protocols. In this non-limiting example, low voltage signal output 36 may provide a signal input to a PLC (not shown).

It will be noted that, in this example, resistor 28 is coupled to the integrating capacitor 20 by a diode 38 that ensures that only positive current will flow to the upper node of integrating capacitor 38. Additional resistors and diodes may also be used in example embodiments. For example, resistor 28 can be a first current-limiting resistor for a first input node of the a high voltage signal input 26 and a resistor 40 can be a second current-limiting resistor for a second input node of the high voltage signal input 26. Furthermore, diode 38 can be a first diode coupled in series with a second diode 42 across the integrating capacitor 20, where the resistor 28 is coupled to a node between diodes 38 and 42. In a further example embodiment, a third diode 44 and a fourth diode 46 are coupled in series across the integrating capacitor. In this example, resistor 40 is coupled to a node between diode 44 and diode 46. It will be appreciated that this arrangement of diodes, set forth by way of example and not limitation, operate as a bridge rectifier to apply only positive potentials to one side of integrating capacitor 20 and only negative potentials to the other side of the integrating capacitor 20.

Electronic switch 24 is preferably a semiconductor switch such as a Metal Oxide Field Effect Transistor (MOSFET). In alternate embodiments, other forms of switches may be used. For example, other types of semiconductor switches such as thyristors are suitable, and in still other applications non-semiconductor switches such as relays are suitable.

In this example embodiment, optical isolator 14 includes a light emitting diode (LED) 48 and a photodiode 50. The optical isolator 14 may be integrated as an integrated circuit 52. Since a purpose of the optical isolator 14 is to provide galvanic isolation between the galvanically isolated section 12 and the low voltage section 16, it is generally not integrated with either section.

It will be appreciated that some or all of the galvanically isolated section 12 can be formed as a part of an integrated circuit (IC). For example, the entire galvanically isolated section 12 can be formed as a part of an IC 54. Alternatively, the diodes 38, 42, 44 and 46, encoder 22, and switch 24 can be formed as a part of an IC 56, with resistors 28 and 40 and integrating capacitor 20 being off-chip. Other combinations are also possible, as will be apparent to those of skill in the art.

In operation, when there is a voltage applied to the high voltage signal input 26 from, for example, a high-voltage switch, current will flow through the resistors 28 and 40 and the diodes 28, 42, 44 and 46 (which serve as an input bridge rectifier) to charge the integrating capacitor 20. It will be noted that the network of resistors and diodes ensure that only positive potentials are applied to one side of the integrating capacitor 20 and only negative potentials are applied to the other side of the integrating capacitor 20, regardless of the polarities present at the input nodes of the high voltage input 26. Therefore, the galvanically isolated section works for DC or AC voltages, and DC voltages of any polarity. In certain embodiments where the input voltage is always DC, the bridge rectifier may be omitted.

The amount of current that can flow into integrating capacitor 20 is determined by the resistance of the resistors 28 and 40. Since, in this example, there are two input resistors, for a total input resistance of R, each resistor will have a resistance of R/2. Since the charging time for integrating capacitor 20 can be approximated by, it will be appreciated that as either R or C increases in value the charging time for the integrating capacitor 20 will also increase. However, since the current through the resistors is directly related to the voltage applied to the resistor, charging current through the resistors will increase with an increase in the voltage levels at high voltage signal input 26. That is, the higher the input voltage, the faster the integrating capacitor 20 will charge.

The current flowing into the integrating capacitor 20 will cause the voltage across the capacitor to increase. When the voltage reaches a reference level, the relaxation oscillator 22 activates the switch 24 (in this example by applying a voltage to the gate of the MOSFET) and causes the integrating capacitor to quickly discharge through the LED 48 of the optical oscillator 14. This will cause an impulse of light to be detected by the photodetector 50 of the optical isolator 14. The decoder 34 uses the resultant electrical pulses from the photodetector 50 to determine the voltage level that was applied to the high voltage signal 26 and to develop the low voltage output signal 36. In general, charge time for the integrating capacitor 20 is much greater than the discharge time of the integrating capacitor 20, and the duration of the charge time is inversely proportional to the voltage level at the high voltage signal input.

By way of non-limiting examples, the high voltage signal input 26 can have AC or DC voltage levels between about 24 V and 240 V. The low voltage signal output can be, for example, 3.3-5.0 VDC. The resistance R can be, by non-limiting example, about 40 KΩ (such that each of resistors 28 and 40 is about 20 KΩ), and the capacitance of integrating capacitor 20 can be about 1 microfarad. In this example, with a threshold voltage of about 6 VDC, the encoder 22 will activate switch 24 and quickly discharge the integrating capacitor 20 through the LED 48. For example, it may take approximately 1 microsecond to discharge the integrating capacitor 20. In contrast, depending upon RC and the input voltage level, it may take 10's of microseconds to 10's of milliseconds to charge up the integrating capacitor 20. Therefore, by detecting the period of time between discharges, the voltage level of the high voltage signal 26 can be computed.

It should be noted that, in certain non-limiting examples as set forth herein, the small input current that charges the capacitor is provided by the digital input, thereby making the encoder 22 both self-powered and compatible with most industrial systems due to minimal current draw. That is, in certain non-limiting examples, the capacitor provides the energy for an optically coupled pulse to be transmitted via the optical isolator 52 without the requirement of an additional power source.

As noted above, the amount of current required of an industrial system can be quite small. By way of a further non-limiting example, if the capacitor 20 is limited by the relaxation trip voltage to about 6V, and if there is 80 kΩ of input resistance, with a 24V input the peak current will be about 225 µA, with the average of about half of that amount. With a 240V input, the current would peak at about 3 mA, in this example. It will be appreciated that the current waveforms can be approximately triangular for certain inputs (e.g. a DC input).

It will be appreciated that, given that the rate of charge is dependent on the current flowing into the capacitor and the current is proportional to the applied voltage, the galvanically isolated section 12 acts, in this non-limiting example, as a voltage-to-frequency converter. The decoder 34 can therefore be, for example, implemented by a period timer and/or a frequency counter, as will be appreciated by those of skill in the art. It is noted, in this example embodiment, that since the output of optical isolator 14 is proportional to the input voltage, an approximate measurement of the input voltage can be determined from the signal on lead 32A. This is because the input current is proportional to the input voltage and output pulse repetition rate of relaxation oscillator 22 is proportional to the input current, in this non-limiting example.

It will be further appreciated that the example digital input 10 as described above is, essentially, a self-powered analog-to-digital (A/D) converter with galvanic isolation between its input and its output. In certain non-limiting examples, the galvanic isolation can be implemented by a serialized signal through an optical isolator.

FIG. 2 is block diagram, set forth by way of example and not limitation, of a multichannel digital input 10' which can be used for a PLC (not shown) and other purposes. In this example, the digital input 10' has N channels. For example, N can be equal to 10. The multichannel digital input 10' includes, in this non-limiting example, N high voltage signal inputs 26(1), 26(2) ... 26(N), N galvanically isolated sections 12(1), 12(2) ... 12(N), N optical isolators 14(1), 14(2) ... 14(N), N decoders 34(1), 34(2) 34(N), and N low voltage signal outputs 36(1), 36(2) ... 36(N). To provide galvanic isolation between the high voltage and low voltage portions of the circuit, it is preferred that the galvanically isolated sections 12(1), 12(2) ... 12(N) and the optical isolators 14(1), 14(2) ... 14(N) be formed as separate integrated circuits. However, the low voltage decoders 34(1), 34(2) ... 34(N) can be formed as a single integrated circuit 58, as separate integrated circuits, or in other combinations.

It will therefore be appreciated that in an embodiment, set forth by way of example and not limitation, a multichannel digital input 10' includes: (a) a plurality of high voltage input channels each having: (i) an integrating capacitor coupled to a high voltage signal input by at least one current-limiting resistor, (ii) a relaxation oscillator coupled across the integrating capacitor, and (iii) an electronic switch controlled by the relaxation oscillator; (b) a plurality of optical isolators each having an input side and an output side, wherein the input side of each optical isolator is coupled to one of the plurality of high voltage input channels; and (c) a plurality of low voltage output channels each including a decoder having an input coupled one of the optical isolators and having a low voltage channel output. In an example embodiment, the plurality of high voltage input channels are electrically isolated from each other and the plurality of low voltage output channels are formed as part of a single integrated circuit.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. For example, while various example embodiments use a relaxation oscillator as an encoder and a timer/counter as a decoder, other serial encoders and decoders can also be used. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A digital input detection circuit comprising:
   (a) a galvanically isolated section including
      (i) an integrating capacitor coupled to a high voltage signal input by at least one current-limiting resistor,
      (ii) a relaxation oscillator coupled across the integrating capacitor, and
      (iii) an electronic switch controlled by the relaxation oscillator;
   (b) an optical isolator having an input side and an output side, wherein the input side is coupled across the integrating capacitor by the switch; and
   (c) a low voltage section including a decoder having an input coupled to the output side of the optical isolator and having a low voltage signal output;
   whereby the optical isolator provides galvanic isolation between the galvanically isolated section and the low voltage section.

2. A digital input detection circuit as recited in claim 1 wherein the integrating capacitor is coupled to the at least one current-limiting resistor by at least one diode.

3. A digital input detection circuit as recited in claim 2 wherein the electronic switch comprises a Metal Oxide Field Effect Transistor (MOSFET).

4. A digital input detection circuit as recited in claim 3 where the input side of the optical oscillator comprises a light emitting diode (LED).

5. A digital input detection circuit as recited in claim 4 wherein the output side of the optical comprises a photodetector.

6. A digital input detection circuit as recited in claim 5 wherein the at least one current-limiting resistor is a first resistor coupled to a first node of the high voltage signal input and further comprising a second current limiting resistor coupled to a second node of the high voltage signal input.

7. A digital input detection circuit as recited in claim 6 wherein the at least one diode is a first diode and further comprising a second diode coupled in series with the first diode across the integrating capacitor.

8. A digital input detection circuit as recited in claim 7 further comprising a third diode and a fourth diode coupled in series with the third diode across the integrating capacitor and connected to the second current limiting resistor.

9. A digital input detection circuit as recited in claim 8 wherein the first current limiting resistor is coupled to a node between the first diode and the second diode and the second current limiting resistor is coupled to a node between the third diode and the fourth diode.

10. A self-powered analog-to-digital converter with galvanic isolation comprising:
    an integrating capacitor coupled to a high voltage signal input by at least one current-limiting resistor;
    an encoder powered by a voltage developed across the integrating capacitor and operative to develop a serialized signal representative of the high voltage signal; and
    an isolator having an input coupled to an output of the serial encoder.

11. A self-powered analog-to-digital converter with galvanic isolation as recited in claim 10 further comprising a decoder coupled to an output of the isolator.

12. A self-powered analog-to-digital converter with galvanic isolation as recited in claim 11 further comprising a bridge rectifier having an input coupled to the high voltage signal and an output coupled to the integrating capacitor.

13. A self-powered analog-to-digital converter with galvanic isolation as recited in claim 12 wherein the bridge rectifier is coupled to the high voltage signal by the at least one current-limiting resistor.

14. A self-powered analog-to-digital converter with galvanic isolation as recited in claim 13 wherein the encoder comprises a relaxation oscillator.

15. A self-powered analog-to-digital converter with galvanic isolation as recited in claim 14 further comprising an electronic switch controlled by an output of the encoder to control a serialized signal applied to the input of the isolator.

16. A self-powered analog-to-digital converter with galvanic isolation as recited in claim 15 wherein the isolator comprises an optical isolator including a light emitting diode coupled to the input and a photodiode coupled to the output.

17. A high voltage input circuit as recited in claim 16 wherein the relaxation oscillator and the electronic switch are formed as part of an integrated circuit.

18. A high voltage input circuit as recited in claim 17 wherein at least one of the at least one of the at least one of the integrating capacitor and the isolator are formed as part of the integrated circuit.

19. A multichannel interface comprising:
    (a) a plurality of high voltage input channels each including:
       (i) an integrating capacitor coupled to a high voltage signal input by at least one current-limiting resistor,
       (ii) a relaxation oscillator coupled across the integrating capacitor, and
       (iii) an electronic switch controlled by the relaxation oscillator;
    (b) a plurality of optical isolators each having an input side and an output side, wherein the input side of each optical isolator is coupled to one of the plurality of high voltage input channels; and
    (c) a plurality of low voltage output channels each including a decoder having an input coupled one of the optical isolators and having a low voltage channel output.

20. A multichannel interface as recited in claim 19 wherein the plurality of high voltage input channels are electrically isolated from each other and the plurality of low voltage output channels are formed as part of a single integrated circuit.

* * * * *